(12) United States Patent
Ha et al.

(10) Patent No.: US 12,316,344 B2
(45) Date of Patent: May 27, 2025

(54) METHOD AND APPARATUS FOR CONSTRUCTING FAST CONVERGING POLAR CODES WITH BELIEF PROGAPATION DECODER

(71) Applicant: Korea Advanced Institute Of Science And Technology, Daejeon (KR)

(72) Inventors: Jeongseok Ha, Daejeon (KR); Seokju Han, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 18/061,120

(22) Filed: Dec. 2, 2022

(65) Prior Publication Data

US 2023/0179228 A1 Jun. 8, 2023

(30) Foreign Application Priority Data

Dec. 6, 2021 (KR) .................. 10-2021-0172837

(51) Int. Cl.
*H03M 13/11* (2006.01)
*H03M 13/00* (2006.01)
*H03M 13/13* (2006.01)
*H03M 13/37* (2006.01)
*H04L 1/00* (2006.01)

(52) U.S. Cl.
CPC .... *H03M 13/1111* (2013.01); *H03M 13/1128* (2013.01); *H03M 13/6362* (2013.01); *H03M 13/13* (2013.01); *H03M 13/3746* (2013.01); *H04L 1/0057* (2013.01); *H04L 1/0068* (2013.01)

(58) Field of Classification Search
CPC .......... H03M 13/1111; H03M 13/6362; H03M 13/3746; H03M 13/13; H03M 13/1128; H04L 1/0057; H04L 1/0068
See application file for complete search history.

(56) References Cited

U.S. PATENT DOCUMENTS

2018/0241414 A1* 8/2018 Gresset ............ H03M 13/2957
2021/0359784 A1* 11/2021 Iscan .................... H04L 1/0005
2021/0376863 A1* 12/2021 Chiueh ............... H03M 13/458

FOREIGN PATENT DOCUMENTS

KR 10-2019-0013660 2/2019

OTHER PUBLICATIONS

Han et al. "Polar Codes for Fast Converging Belief-Propagation Decoding." 2021 International Conference on Information and Communication Technology Convergence (ICTC). IEEE, 2021.

* cited by examiner

*Primary Examiner* — Mark D Featherstone
*Assistant Examiner* — Sazzad Hossain
(74) *Attorney, Agent, or Firm* — NIXON PEABODY LLP

(57) ABSTRACT

Disclosed is a method for constructing a fast converging polar code based on a belief propagation decoder. The method includes analyzing decoding importance for each individual bit of an initial belief propagation decoder, and reconstructing the polar code depending on an analyzing result.

15 Claims, 6 Drawing Sheets

METHOD AND APPARATUS FOR CONSTRUCTING FAST CONVERGING POLAR CODES WITH BELIEF PROGAPATION DECODER

CROSS-REFERENCE TO RELATED APPLICATIONS

A claim for priority under 35 U.S.C. § 119 is made to Korean Patent Application No. 10-2021-0172837 filed on Dec. 6, 2021 in the Korean Intellectual Property Office, the entire contents of which are hereby incorporated by reference.

BACKGROUND

Embodiments of the present disclosure described herein relate to a method and an apparatus for constructing fast converging polar codes with a belief propagation decoder, and more particularly, relate to a way to construct polar codes being error correcting codes.

Nowadays, the research on the 6G URLLC (Ultra Reliable Low Latency Communication) technology in addition to the 5G communication technology is being treated as an important issue. This requires the low latency and high reliability while exchanging short packets in autonomous driving and IoT devices, and the research and development on related communication technologies is required. In the communication technology, channel codes are used to correct an error caused in the communication process. Among the channel codes, polar codes that are codes known to achieve the channel capacity in a discrete symmetric channel are used in various fields in which it is adopted in the control signal standard for 5G. The polar codes are designed through a channel polarization process, and the codeword is generated by placing a desired message in a channel with high reliability generated through channel polarization and setting a frozen bit being a pre-shared value in a channel with low reliability. The decoding of initial polar codes utilizes successive cancellation (SC) decoding that is used to sequentially decode information bits; however, a successive cancellation decoder requires a long delay time in the process of sequentially decoding information bits, which makes the application to ultra-low latency services of 6G difficult. Accordingly, the research is currently underway to apply a belief propagation (BP) decoder, which is capable of performing a parallel operation, to the polar codes.

The belief propagation decoding of the polar codes is performed through message propagation between adjacent nodes within the butterfly network of polar codes. The belief propagation decoder is capable of efficiently estimating information bits through the parallel operation based on the message received from the channel. However, to improve the performance of error correction, the sufficient number of the message propagation iterations is required, and the decoding delay time of the polar codes increases in proportion to the number of iterations of the belief propagation decoder. Accordingly, to implement a short decoding delay time, it is essential to design polar codes capable of making high error correction performance even at the low number of times of the iteration, but the related research is still insufficient.

SUMMARY

Embodiments of the present disclosure are directed to construct polar codes capable of improving initial reliability and efficiently reducing a decoding delay time, by analyzing decoding importance between individual nodes in an individual polarization kernel in a belief propagation decoding process at the initial number of iterations of the polar codes and again constructing the polar codes based on the analyzing result.

According to an embodiment, a method for constructing a fast converging polar code based on a belief propagation decoder includes analyzing decoding importance for each individual bit of an initial belief propagation decoder, and reconstructing the polar code depending on an analyzing result.

The analyzing may include analyzing decoding importance between individual nodes within an individual polarization kernel in a belief propagation decoding process at the initial number of iterations of the initial belief propagation decoder.

The fact that bit importance is determined depending on an index of a codeword bit in the initial belief propagation decoding process through a message propagation analysis in the polarization kernel of the polar code and the fact that the degree of contribution becomes greater in the initial belief propagation decoding process as an index of a bit becomes higher may be used to construct the fast converging polar code.

The analyzing may include analyzing the degree of contribution of a message through a codeword bit stage and a message bit stage, in a belief propagation decoding process at the initial number of iterations of the initial belief propagation decoder.

The reconstructing may include additionally transmitting a bit having a highest index by removing a bit having a lowest index from among all codeword bits through puncturing for removing some of the codeword bits and extending for transmitting an additional bit and allocating the degree of freedom, which is secured by removing the bit having the lowest index, to a bit having the highest index.

The reconstructing may include maintaining a structure of the polar code by allocating the secured degree of freedom to the bit having the highest index.

The again constructing may include applying the fact that a bit having a low index from among the codeword bits has a small influence on initial decoding and a bit having a relatively high index has a greater influence on the initial decoding, by repeatedly utilizing the fact that a node with a high index has the higher degree of contribution than a node with a relatively low index.

According to an embodiment, a method for constructing a fast converging polar code based on a belief propagation decoder includes analyzing decoding importance between individual nodes within an initial belief propagation decoder, in a belief propagation decoding process at the initial number of iterations of an initial belief propagation decoder, and reconstructing the polar code depending on an analyzing result, and the fact that bit importance is determined depending on an index of a codeword bit in an initial belief propagation decoding process through a message propagation analysis in the polarization kernel of the polar code and the fact that the degree of contribution becomes greater in the initial belief propagation decoding process as an index of a bit becomes higher may be used.

The analyzing may include analyzing the degree of contribution of a message through a codeword bit stage and a message bit stage, in the belief propagation decoding process at the initial number of iterations of the initial belief propagation decoder.

The reconstructing may include additionally transmitting a bit having a highest index by removing a bit having a lowest index from among all codeword bits through puncturing for removing some of the codeword bits and extending for transmitting an additional bit and allocating the degree of freedom, which is secured by removing the bit having the lowest index, to a bit having the highest index.

The reconstructing may include maintaining a structure of the polar code by allocating the secured degree of freedom to the bit having the highest index.

According to an embodiment, an apparatus for constructing a fast converging polar code based on a belief propagation decoder includes an analysis unit that analyzes decoding importance for each individual bit of an initial belief propagation decoder, and a processing unit that reconstructs the polar code depending on an analyzing result.

The analysis unit may analyze decoding importance between individual nodes within an individual polarization kernel in a belief propagation decoding process at the initial number of iterations of the initial belief propagation decoder.

The fact that bit importance is determined depending on an index of a codeword bit in an initial belief propagation decoding process through a message propagation analysis in the polarization kernel of the polar code and the fact that the degree of contribution becomes greater in the initial belief propagation decoding process as an index of a bit becomes higher may be used to construct the fast converging polar code.

The analysis unit may analyze the degree of contribution of a message through a codeword bit stage and a message bit stage, in a belief propagation decoding process at the initial number of iterations of the initial belief propagation decoder.

The processing unit may additionally transmit a bit having a highest index by removing a bit having a lowest index from among all codeword bits through puncturing for removing some of the codeword bits and extending for transmitting an additional bit and allocating the degree of freedom, which is secured by removing the bit having the lowest index, to a bit having the highest index.

The processing unit may maintain a structure of the polar code by allocating the secured degree of freedom to the bit having the highest index.

The processing unit may apply the fact that a bit having a low index from among the codeword bits has a small influence on initial decoding and a bit having a relatively high index has a greater influence on the initial decoding, by repeatedly utilizing the fact that a node with a high index has the higher degree of contribution than a node with a relatively low index.

According to an embodiment, a method for constructing a fast converging polar code based on a belief propagation decoder may include analyzing decoding importance for each individual bit of an initial belief propagation decoder by analyzing the degree of contribution of a message through a codeword bit stage and a message bit stage, in a belief propagation decoding process at the initial number of iterations of the initial belief propagation decoder, and reconstructing the polar code depending on an analyzing result.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Other aspects, features and advantages of the present disclosure will become apparent from embodiments to be described in detail in conjunction with the accompanying drawings. However, the present disclosure is not limited to the embodiments disclosed below, but may be implemented in various forms. The embodiments of the present disclosure are only provided to make the disclosure of the invention complete and fully inform those skilled in the art, to which the inventive concept pertains, of the scope of the invention.

The terms used in the specification are provided to describe embodiments, not intended to limit the invention. In the specification, the singular forms include plural forms unless particularly mentioned. The terms "comprises" and/or "comprising," when used in the specification, specify the presence of components, steps, operations, and/or elements, but do not preclude the presence or addition of one or more other components, steps, operations, and/or elements.

Unless otherwise defined, all terms (including technical and scientific terms) used herein have the same meaning as commonly understood by those skilled in the art to which the inventive concept pertains. Also, the terms that are defined in commonly used dictionaries should not be interpreted in an idealized or overly formal sense unless expressly so defined herein.

Below, embodiments of the present disclosure will be described in detail with reference to the accompanying drawings. In the specification, the same reference numerals/signs are used for the same components in drawings, and thus, additional description will be omitted the same elements redundancy.

Embodiments of the present disclosure are directed to again construct polar codes based on a result of analyzing decoding importance between individual nodes within an individual polarization kernel in a belief propagation decoding process at the initial number of times of an iteration.

In detail, the present disclosure is directed to construct polar codes capable of efficiently reducing a decoding delay time, that is, improving initial reliability of a belief propagation decoder while maintaining a polar code structure, by removing a codeword bit having the lowest decoding importance from among codeword bits of the polar code based on puncturing and extending techniques among error correction code constructing techniques and allocating the degree of freedom, which is secured by removing the bit, to a bit having high decoding importance.

Below, embodiments of the present disclosure will be described in detail with reference to FIGS. 1 to 6.

Figure 1:
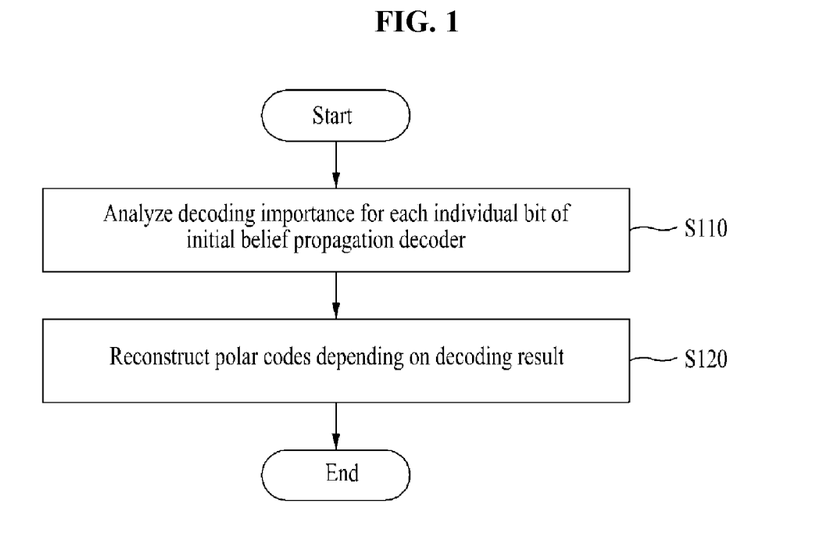
FIG. 1 illustrates an operation flowchart of a fast converging polar code constructing method based on a belief propagation decoder according to an embodiment of the present disclosure.

FIG. 1 illustrates an operation flowchart of a fast converging polar code constructing method based on a belief propagation decoder according to an embodiment of the present disclosure.

Figure 6:
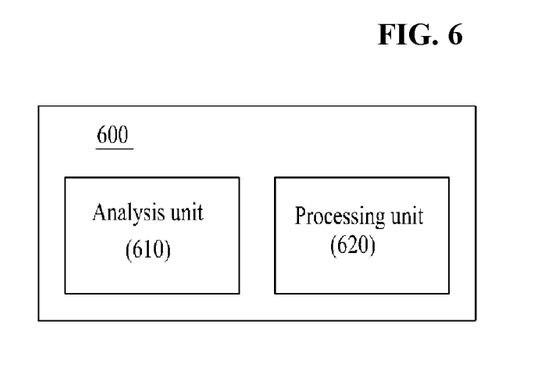
FIG. 6 is a block diagram illustrating a configuration of a fast converging polar code constructing apparatus based on a belief propagation decoder in detail, according to an embodiment of the present disclosure.

The method of FIG. 1 is performed by a fast converging polar code constructing device based on a belief propagation decoder according to an embodiment of the present disclosure illustrated in FIG. 6.

Referring to FIG. 1, in operation S110, decoding importance is analyzed for each individual bit of an initial belief propagation decoder. In operation S120, polar codes are again constructed depending on the decoding result.

In operation S110 that corresponds to the belief propagation decoding process at the initial number of iterations of the initial belief propagation decoder, the decoding importance between individual nodes within the individual polarization kernel is analyzed. In this case, the fast converging polar code constructing method according to an embodiment uses the fact that bit importance is determined depending on an index of a codeword bit in the initial belief propagation decoding process through a message propagation analysis in the polarization kernel of the polar code and the fact that the degree of contribution becomes greater in the initial belief propagation decoding process as an index of a bit becomes higher.

In operation S110 that corresponds to the belief propagation decoding process at the initial number of iterations of the initial belief propagation decoder, there may be analyzed the degree of contribution of a message through a codeword bit stage and a message bit stage. Next, in operation S120, a bit having the highest index may be additionally transmitted by removing bits having the lowest index from among all the codeword bits through the puncturing for removing some of the codeword bits and the extending for transmitting an additional bit and allocating the degree of freedom, which is secured by removing the bits having the lowest index, to a bit having the highest index. In this case, the structure of the polar code may be maintained by allocating the degree of freedom secured in operation S120 to the bit having the highest index.

In operation S120 according to an embodiment of the present disclosure, the fact that a bit having a low index from among codeword bits has a small influence on initial decoding and a bit having a relatively high index has a greater influence on initial decoding is applied by repeatedly utilizing the fact that a node with a high index has the higher degree of contribution than a node with a relatively low index.

Figure 2:
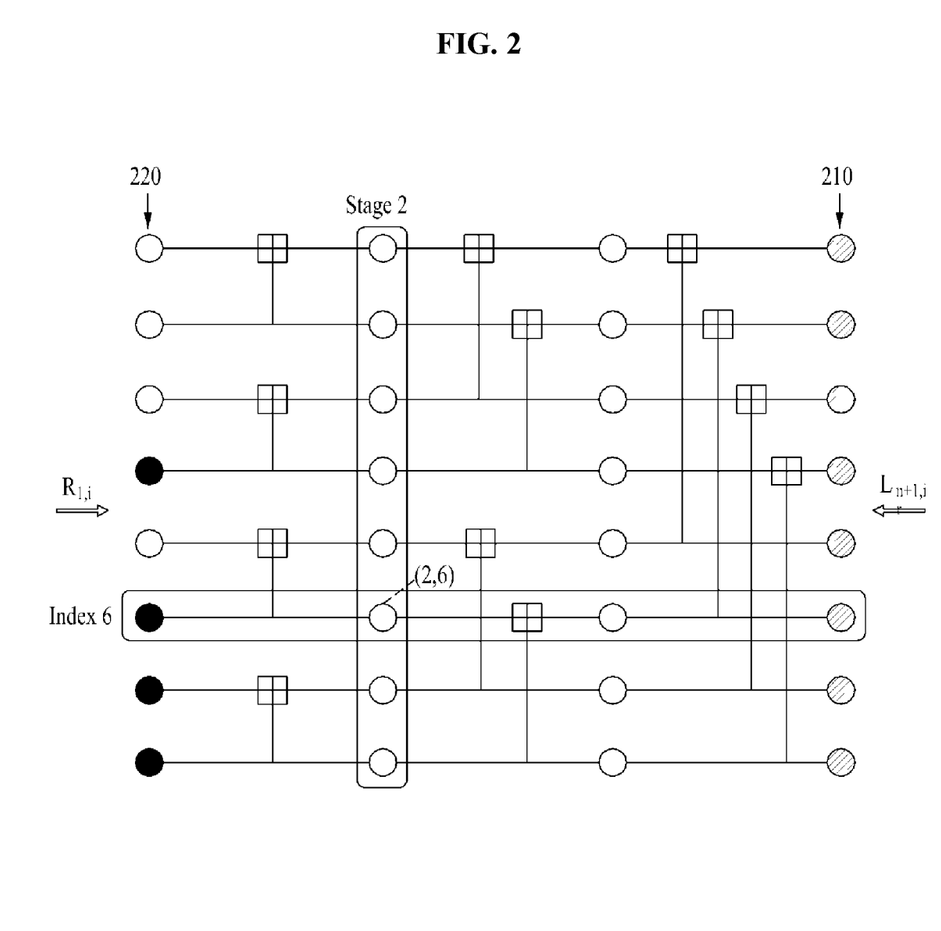
FIG. 2 is a diagram illustrating a butterfly network structure for polar codes.
Figure 3:
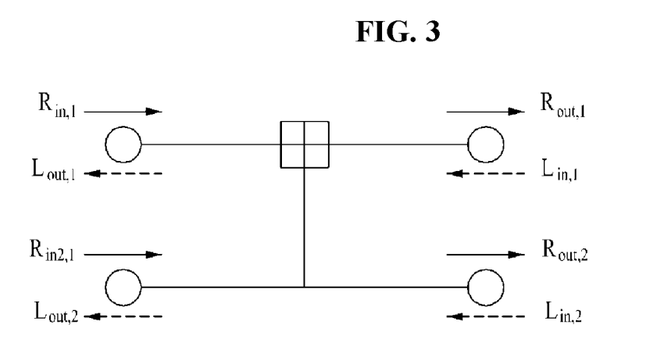
FIG. 3 is a diagram describing a polarization kernel structure for polar codes and a message propagation process.

FIG. 2 is a diagram illustrating a butterfly network structure for polar codes, and FIG. 3 is a diagram describing a polarization kernel structure for polar codes and a message propagation process.

Belief propagation decoding is performed through a message propagation within the butterfly network structure for polar codes as illustrated in FIG. 2. Initially, a log-likelihood ratio (LLR) message is received from a channel through a codeword bit (210) stage being the rightmost node, and the received message is propagated to a message bit (220) stage being the leftmost node. In this case, a message propagated from the codeword bit (210) stage to the message bit (220) stage is defined as a left message "L". Afterwards, for an iterative message transfer, the message propagated to the message bit (220) stage is again propagated to the codeword bit (210) stage depending on the given number of iterations, which is defined as a right message "R".

As the left message and the right message are repeatedly propagated, decoding is performed. Initially, both the left message and the right message are initialized with a value of "0", and the reliability of ∞ is given to a frozen bit. Message propagation between nodes in the network may be expressed as an iterative structure of the individual polarization kernel as illustrated in FIG. 3, and a message that is propagated in the individual polarization kernel is calculated by Equation 1 below.

$$L_{out,1} = g(L_{in,1}, L_{in,2} + R_{in,1}),$$

$$L_{out,2} = g(R_{in,1}, L_{in,2}) + L_{in,2},$$

$$R_{out,1} = g(R_{in,1}, L_{in,2} + R_{in,2}),$$

$$R_{out,2} = g(R_{in,1}, L_{in,1}) + R_{in,2}.$$  [Equation 1]

Herein, $$g(x, y) = \ln \frac{\cosh((x+y)/2)}{\cosh((x-y)/2)}$$

represents and outputs messages smaller in size than input messages "x" and "y".

Because most messages are initialized with "0" in the initial decoding process of the belief propagation decoder, the left message that transfers the message received from the channel plays a key role in the decoding process.

In this case, in the individual polarization kernel as illustrated in FIG. 3, two input left messages $L_{in,1}$ and $L_{in,2}$ have different degrees of contribution in the initial belief propagation decoding process. With regard to $L_{out,1}$, both $L_{in,1}$ and $L_{in,2}$ are propagated through the same "g" operation; however, with regard to $L_{out,2}$, $L_{in,1}$ is propagated through the "g" operation, and $L_{in,2}$ is propagated through a simple "+" operation. Herein, the message that is propagated through the "+" operation conveys the input message in an intact state, but the message that is propagated through the "g" operation conveys the message weakened compared to the input message; in this case, $L_{in,2}$ makes a great contribution to determining $L_{out,2}$ compared to $L_{in,1}$. From the above description, it may be seen that $L_{in,2}$ makes a higher contribution than $L_{in,1}$ in the decoding process of the initial belief propagation decoder. This may mean that a node with a high index makes a higher contribution than a node with a low index in consideration of the extension to the entire butterfly network structure.

By utilizing the above fact repeatedly, it may be seen that a bit having a low index from among the codeword bits has a small influence on the initial decoding and a bit having a high index has a greater influence on the initial decoding. According to the above description, in the present disclosure, by applying the puncturing being a technique for removing some of the codeword bits and the extending being a technique for transmitting an additional bit, "$n_F$" bits having the lowest index from among all the codeword bits are removed, and the degree of freedom secured by removing the "$n_F$" bits is assigned to a bit with a high index. As such, a bit having the highest index is additionally transmitted "$n_F$" times. This may mean that there is improved the performance at the initial number of iterations of the belief propagation decoder.

Figure 4:
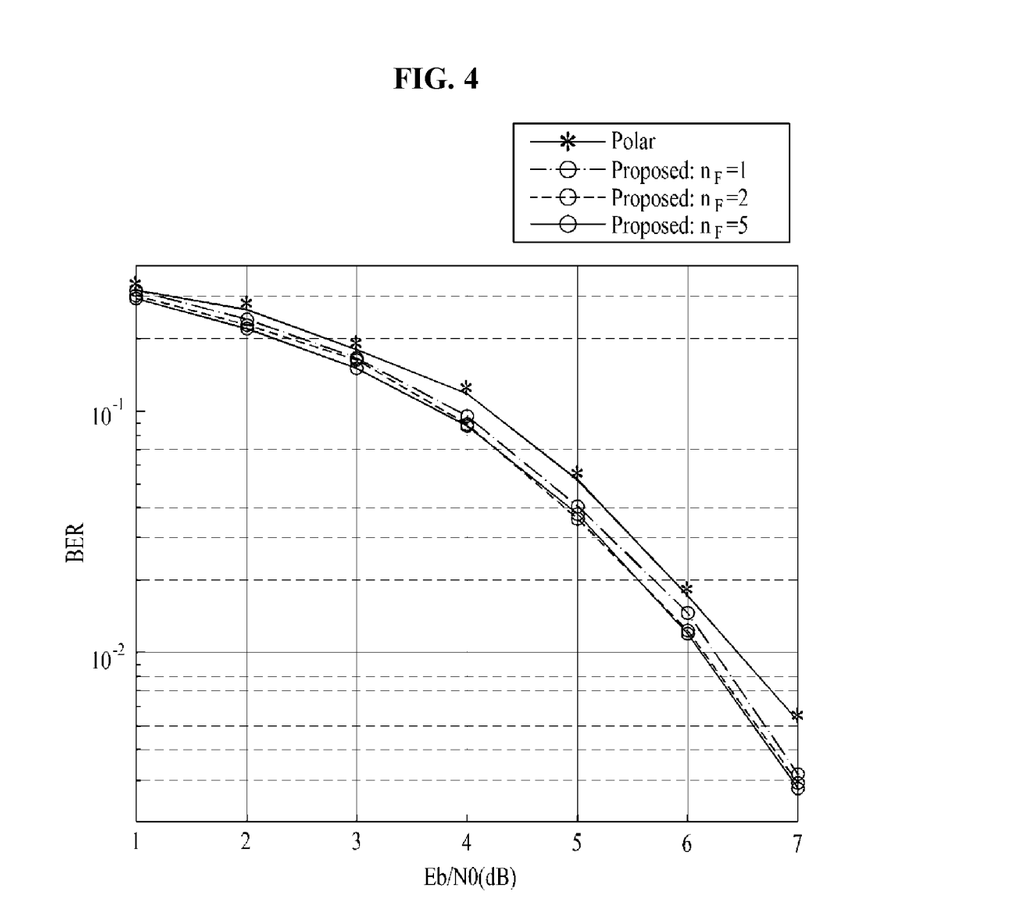
FIG. 4 is a diagram illustrating bit error rate performance results according to Eb/No of a channel, according to an embodiment of the present disclosure.
Figure 5:
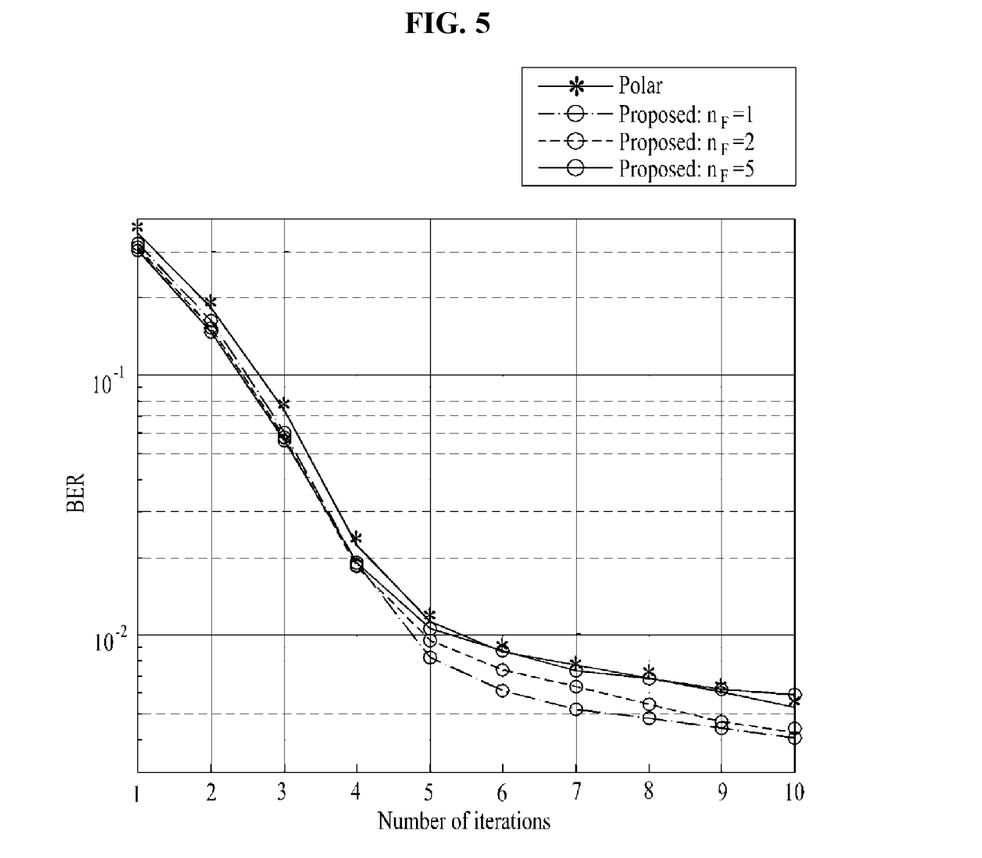
FIG. 5 is a diagram illustrating bit error rate performance results according to the number of iterations of belief propagation decoding, according to an embodiment of the present disclosure.

FIG. 4 is a diagram illustrating bit error rate performance results according to Eb/No of a channel, according to an embodiment of the present disclosure, and FIG. 5 is a diagram illustrating bit error rate performance results according to the number of times of an iteration of belief propagation decoding, according to an embodiment of the present disclosure.

The performance of algorithm described in the present disclosure is shown in FIGS. 4 and 5. The experiment uses a (128, 40) polar code with a codeword length of 128 and a message length of 40, which is used in the 5G standard 3GPP NR to verify actual performance.

FIG. 4 shows the bit error rate performance of an existing polar code when the maximum number of iterations is 2 and the bit error rate performance of a polar code to which the proposed construction technique is applied. According to the results of the graph, it may be confirmed that the proposed algorithm improves the polar code performance at the low number of times of an iteration as "$n_F$" being the number of iterative bits increases.

Also, FIG. 5 shows the error correction performance for each iteration count of the constructed polar code, which indicates a convergence speed of the belief propagation decoder. From the results of the graph, it is understood that the proposed algorithm improves the belief propagation decoding convergence speed of the existing polar code and not only the initial reliability but also the final performance of the code are improved by selecting the iteration bit number appropriately. The proposed construction scheme may be used to improve the convergence speed of the belief propagation decoder through the combination with all existing polar code construction schemes in addition to the 3GPP NR-based polar codes. As such, it is expected as being utilized as a core technology for the 6G communication.

The present disclosure relates to a method and an apparatus for constructing polar codes with an improved convergence speed of a belief propagation decoder and is directed to provide a technology for analyzing the importance for each individual bit of an initial belief propagation decoder and again constructing the polar codes based on the analysis result. Through the message propagation analysis in the polarization kernel of polar codes, the importance of bit in the initial belief propagation decoding process is determined depending on the index of the codeword bit, and it is confirmed that as an index of a bit becomes higher, the bit makes a great contribution to the initial belief propagation decoding process. Accordingly, the proposed construction scheme transmits an additional bit iteratively by removing a bit having low importance (or a bit having a low index) from among codeword bits through the puncturing and allocating the degree of freedom obtained through the puncturing to a bit having high importance (or a bit having the highest index). According to the above description, the reliability of the initial belief propagation decoder is improved compared to the existing polar code structure, thus implementing high error correction performance with only the small number of iterations; in addition, final error correction performance may be improved, the limitations of the existing polar codes may be solved, and the present disclosure may be utilized as the core technique of the 6G standard.

FIG. 6 is a block diagram illustrating a configuration of a fast converging polar code constructing apparatus based on a belief propagation decoder in detail, according to an embodiment of the present disclosure.

Referring to FIG. 6, a fast converging polar code constructing apparatus according to an embodiment of the present disclosure again constructs polar codes depending on the decoding importance analyzed for each individual bit of an initial belief propagation decoder.

To this end, a fast converging polar code constructing apparatus 600 includes an analysis unit 610 and a processing unit 620.

The analysis unit 610 analyzes the decoding importance for each individual bit of the initial belief propagation decoder. Afterwards, the processing unit 620 again constructs polar codes depending on the analysis result.

The analysis unit 610 analyzes the decoding importance between individual nodes within the individual polarization kernel in the initial belief propagation decoding process at the initial number of iterations of the initial belief propagation decoder. In this case, the fast converging polar code constructing apparatus 600 according to an embodiment of the present disclosure determines the bit importance according to the index of a codeword bit in the initial belief propagation decoding process through the message propagation analysis in the polarization kernel of polar codes and uses the characteristic that a bit makes a greater contribution to the initial belief propagation decoding process as an index of a bit becomes higher.

The analysis unit 610 may analyze the contribution of the message through the codeword bit stage and the message bit stage in the belief propagation decoding process at the initial number of iterations of the initial belief propagation decoder. Accordingly, the processing unit 620 may additionally transmit a bit having the highest index by removing bits having the lowest index from among all the codeword bits through the puncturing for removing some of the codeword bits and the extending for transmitting an additional bit and allocating the degree of freedom secured by removing the bits having the lowest index to a bit having the highest index. In this case, the processing unit 620 may maintain the polar code structure by allocating the degree of freedom thus secured to the bit having the highest index.

The processing unit 620 according to an embodiment of the present disclosure is characterized in that the fact that a bit having a low index from among codeword bits has a small influence on initial decoding and a bit having a relatively high index has a greater influence on initial decoding is applied by repeatedly utilizing the fact that a node with a high index has the higher degree of contribution than a node with a relatively low index.

Even though the description is omitted in the device of FIG. 6, each component means of FIG. 6 may include all of the contents described with reference to FIGS. 1 to 5, which is obvious to one skilled in the art.

The above systems or devices may be implemented with hardware components, software components, and/or a combination of hardware components and software components. For example, the devices and components described in the embodiments may be implemented with one or more general-purpose computers or special-purpose computers, such as a processor, a controller, an arithmetic logic unit (ALU), a digital signal processor, a microcomputer, a field programmable gate array (FPGA), a programmable logic unit (PLU), a microprocessor, or any device which may execute instructions and may respond. A processing unit may perform an operating system (OS) or one or more software applications running on the OS. Also, the processing unit may access, store, manipulate, process, and generate data in response to the execution of software. It will be understood by one skilled in the art that although a single processing unit may be illustrated for convenience of understanding, the processing unit may include a plurality of processing elements and/or a plurality of types of processing elements. For example, the processing unit may include a plurality of processors or one processor and one controller. Also, the processing unit may have a different processing configuration, such as a parallel processor.

Software may include computer programs, codes, instructions or one or more combinations thereof and constitutes a processing unit to operate in a desired manner or controls the processing unit independently or collectively. Software and/or data may be permanently or temporarily embodied in any type of machine, component, physical equipment, virtual equipment, or computer storage medium or unit, or in a transmitted signal wave so as to be interpreted by the processing unit or to provide instructions or data to the processing unit. Software may be distributed on computer systems connected over a network so as to be stored therein or executed thereon. Software and data may be recorded in one or more computer-readable storage media.

The methods according to the embodiments may be implemented in the form of program instructions capable of being executed by various computer means and may be recorded in a computer-readable medium. The computer-readable medium may also include program instructions, data files, data structures, or a combination thereof. The program instructions recorded in the medium may be designed and configured specially for the embodiment or may be known and available to one skilled in computer software. The computer-readable storage medium may include a hardware device, which is specially configured to store and execute program instructions, such as a magnetic medium (e.g., a hard disk drive or a magnetic tape), an optical medium (e.g., CD-ROM or DVD), a magneto-optical medium (e.g., a floptical disk), a read only memory (ROM), a random access memory (RAM), or a flash memory. As an example, the program instructions include not only machine language codes created by a compiler but also high-level language codes that are capable of being executed by a computer by using an interpreter or the like. The above hardware devices may be configured to act as one or more software modules to perform the operations of the above embodiments, and vice versa.

According to an embodiment of the present disclosure, by constructing polar codes based on a result of analyzing decoding importance between individual nodes within an individual polarization kernel in a belief propagation decoding process at the initial number of iterations of the polar code, it may be possible to improve initial reliability of a belief propagation decoder and to efficiently reduce a decoding delay time.

According to an embodiment of the present disclosure, through the reconstruction of polar codes, it may be possible to reduce an initial error rate of an existing polar code and to improve error correction performance and delay time of the polar code.

However, the present disclosure is not limited to the effects, and the effects may be variously expanded without departing from the technical spirit and scope of the invention.

While the present disclosure has been described with reference to exemplary embodiments, it will be apparent to those skilled in the art that various changes and modifications may be made without departing from the spirit and scope of the present disclosure. Therefore, it should be understood that the above embodiments are not limiting, but illustrative.

What is claimed is:

1. A method for constructing a fast converging polar code based on a belief propagation decoder at a transmitter node of a network to propagate messages through channels of the network to a receiver node, the method comprising:
analyzing decoding importance for each individual bit of an initial belief propagation decoder in channels of the network via an analysis unit of a fast converging polar code construction apparatus of the belief propagation decoder, wherein the analyzing includes determining a degree of contribution to decoding a message propagation by each individual bit, the decoding performed by the initial belief propagation decoder, and generating an index including index values corresponding to the degree of contribution of each individual bit to decoding the message propagation;
reconstructing the polar code depending on an analyzing result using the individual bit having the highest index value from the index via a processing unit of the fast converging polar code construction apparatus; and
applying the reconstructed polar code to provide error correction for data in the channels of the network via the belief propagation decoder; and
propagating a message decoded using the reconstructed polar code from the transmitter node of the network to the receiver node over the channels of the network.

2. The method of claim 1, wherein the analyzing includes:
analyzing decoding importance between individual nodes within an individual polarization kernel in a belief propagation decoding process at an initial iteration of a number of iterations of the initial belief propagation decoder.

3. The method of claim 1, wherein the analyzing includes:
analyzing the degree of contribution of a message through a codeword bit stage and a message bit stage, in a belief propagation decoding process at an initial iteration of a number of iterations of the initial belief propagation decoder.

4. The method of claim 3, wherein the reconstructing includes:
additionally transmitting a bit having the highest index value by removing a bit having a lowest index value from among all codeword bits through puncturing for removing some of the codeword bits and extending for transmitting an additional bit and allocating a degree of freedom, which is secured to produce a secured degree of freedom by removing the bit having the lowest index value, to the bit having the highest index value.

5. The method of claim 4, wherein the reconstructing includes:
maintaining a structure of the polar code by allocating the secured degree of freedom to the bit having the highest index value.

6. A method for constructing a fast converging polar code based on a belief propagation decoder at a transmitter node of a network to propagate messages through channels of the network to a receiver node, the method comprising:
analyzing decoding importance between individual nodes within an initial belief propagation decoder in channels of the network via an analysis unit of a fast converging polar code construction apparatus of the belief propagation decoder, wherein the analyzing includes determining a degree of contribution for each individual node in a belief propagation decoding process performed on a message propagation at an initial iteration of a number of iterations of the an initial belief propagation decoder, wherein each individual node has a codeword bit, and wherein an index value for each codeword bit is generated based on a degree of contribution of the individual node to decoding the message propagation; and reconstructing the polar code depending on an analyzing result via a processing unit of the fast converging polar code construction apparatus, wherein the reconstructing prioritizes a kernel having the highest index value; and applying the reconstructed polar code to provide error correction for data in the channels of the network via the belief propagation decoder; and propagating a message decoded using the reconstructed polar code from the transmitter node of the network to the receiver node over the channels of the network.

7. The method of claim 6, wherein the analyzing includes:
analyzing the degree of contribution of a message through a codeword bit stage and a message bit stage, in the belief propagation decoding process at an initial iteration of the number of iterations of the initial belief propagation decoder.

8. The method of claim 7, wherein the reconstructing includes:
additionally transmitting a bit having a highest index value by removing a bit having a lowest index value from among all codeword bits through puncturing for removing some of the codeword bits and extending for transmitting an additional bit and allocating the degree of freedom, which is secured by removing the bit having the lowest index value, to a bit having the highest index value.

9. The method of claim 8, wherein the reconstructing includes:
maintaining a structure of the polar code by allocating the secured degree of freedom to the bit having the highest index value.

10. An apparatus for constructing a fast converging polar code based on a belief propagation decoder in channels of a network between nodes of the network, comprising:
an analysis unit configured to analyze decoding importance for each individual bit of an initial belief propagation decoder, wherein the analyzing includes determining a degree of contribution to decoding a message propagation by each individual bit, the decoding performed by the initial belief propagation decoder, and generating an index including index values corresponding to the degree of contribution of each individual bit to decoding the message propagation;
a processing unit configured to reconstruct the polar code depending on an analyzing result using the individual bit having the highest index value from the index; and
a communication device applying the reconstructed polar code to provide error correction for data in the channels of the network, the channels propagating a message decoded using the reconstructed polar code between a transmitter node and a receiver node of the network.

11. The apparatus of claim 10, wherein the analysis unit analyzes decoding importance between individual nodes within an individual polarization kernel in a belief propagation decoding process at an initial iteration of a number of iterations of the initial belief propagation decoder.

12. The apparatus of claim 10, wherein the analysis unit analyzes the degree of contribution of a message through a codeword bit stage and a message bit stage, in a belief propagation decoding process at an initial iteration of a number of iterations of the initial belief propagation decoder.

13. The apparatus of claim 12, wherein the processing unit additionally transmits a bit having a highest index value by removing a bit having a lowest index value from among all codeword bits through puncturing for removing some of the codeword bits and extending for transmitting an additional bit and allocating the degree of freedom, which is secured to produce a secured degree of freedom by removing the bit having the lowest index value, to a bit having the highest index value.

14. The apparatus of claim 13, wherein the processing unit maintains a structure of the polar code by allocating the secured degree of freedom to the bit having the highest index value.

15. A method for constructing a fast converging polar code based on a belief propagation decoder in channels of a network between nodes of the network, the method comprising:
analyzing decoding importance for each individual bit of an initial belief propagation decoder via an analysis unit of a fast converging polar code construction apparatus of the belief propagation decoder by analyzing the degree of contribution of a message through a codeword bit stage and a message bit stage, in a belief propagation decoding process at an initial iteration of a number of iterations of the initial belief propagation decoder, wherein the analyzing includes determining a degree of contribution to decoding propagation of the message by each individual bit, and generating an index including index values corresponding to the degree of contribution of each individual bit to decoding the message propagation; and reconstructing the polar code depending on an analyzing result using the individual bit having the highest index value from the index via an analysis unit of a fast converging polar code construction apparatus of the belief propagation decoder; and applying the reconstructed polar code to provide error correction for data in the channels of the network; and propagating a message decoded using the reconstructed polar code from the transmitter node of the network to the receiver node over the channels of the network.

* * * * *